(12) United States Patent
Tera et al.

(10) Patent No.: US 6,933,002 B2
(45) Date of Patent: Aug. 23, 2005

(54) METHOD FOR MANUFACTURING ORGANIC EL DEVICE WITH PROTECTIVE LAYER

(75) Inventors: Ryonosuke Tera, Obu (JP); Toshiki Itoh, Nagoya (JP); Atsushi Yamamoto, Nagoya (JP); Harumi Suzuki, Kariya (JP); Masaaki Ozaki, Kariya (JP); Takeshi Yamauchi, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/345,234

(22) Filed: Jan. 16, 2003

(65) Prior Publication Data

US 2003/0129298 A1 Jul. 10, 2003

Related U.S. Application Data

(62) Division of application No. 09/820,168, filed on Mar. 29, 2001, now abandoned.

(30) Foreign Application Priority Data

Mar. 31, 2000 (JP) .......................... 2000-101304

(51) Int. Cl.$^7$ .......................... C23C 16/40; B05D 5/00; B05D 5/12
(52) U.S. Cl. .......................... 427/66; 117/944; 117/952
(58) Field of Search .................. 427/66, 68; 117/944, 117/952

(56) References Cited

U.S. PATENT DOCUMENTS

| 4,058,430 A | | 11/1977 | Suntola et al. |
| 4,413,022 A | | 11/1983 | Suntola et al. |
| 4,486,487 A | | 12/1984 | Skarp |
| 5,291,066 A | * | 3/1994 | Neugebauer et al. ........ 257/750 |
| 5,505,985 A | * | 4/1996 | Nakamura et al. ............ 427/66 |
| 5,652,067 A | * | 7/1997 | Ito et al. ..................... 428/690 |
| 6,004,632 A | * | 12/1999 | Hsu et al. .................... 427/579 |
| 6,025,627 A | * | 2/2000 | Forbes et al. ............... 257/321 |
| 6,110,757 A | * | 8/2000 | Udagawa ..................... 438/47 |
| 6,124,158 A | * | 9/2000 | Dautartas et al. ........... 438/216 |
| 6,143,434 A | * | 11/2000 | Okada ......................... 428/690 |
| 6,198,220 B1 | * | 3/2001 | Jones et al. ................ 313/512 |
| 6,534,395 B2 | * | 3/2003 | Werkhoven et al. ........ 438/627 |
| 6,538,374 B2 | * | 3/2003 | Hosokawa .................. 313/504 |
| 6,576,053 B1 | * | 6/2003 | Kim et al. .................... 117/89 |
| 6,617,173 B1 | * | 9/2003 | Sneh ............................. 438/3 |
| 2001/0052752 A1 | * | 12/2001 | Ghosh et al. ............... 313/512 |

FOREIGN PATENT DOCUMENTS

| JP | A-7-161474 | | 6/1995 |
| JP | 2000-077181 | * | 3/2000 |

OTHER PUBLICATIONS

Tuomo Suntola, "Atomic Layer Epitaxy," *Handbook of Crystal Growth*, vol. 3, Ch. 14, pp. 601–609.

* cited by examiner

*Primary Examiner*—Michael Cleveland
(74) *Attorney, Agent, or Firm*—Posz Law Group, PLC

(57) ABSTRACT

An organic EL device has a structure in which an anode, a hole transporting layer, an organic luminescent layer, and a cathode are disposed on a glass substrate in this order. The organic EL device further has a protective layer covering an outer surface of the structure to protect it from an external environment. The protective layer is formed by an ALE method at a temperature lower than glass transition temperatures materials constituting the hole transporting layer and the organic luminescent layer.

1 Claim, 10 Drawing Sheets

PREPARE SUBSTRATE WITH EL FILM
SET MASK
PUT IN FURNACE
VACUATE (AT. PRESSURE → 40Pa)
HEAT SUBSTRATE (100°C)
FILM FORMATION
5000 CYCLES
 TMA GAS (0.6sec)
 N2 PURGE (2.4sec)
 H2O GAS (1.0sec)
 N2 PURGE (4.0sec)
COOL (100°C → 70°C)
TAKE OUT

METHOD FOR MANUFACTURING ORGANIC EL DEVICE WITH PROTECTIVE LAYER

CROSS REFERENCE TO RELATED APPLICATION

The present application is a division of application Ser. No. 09/820,168, filed on Mar. 29, 2001 now abandoned, entitled ORGANIC EL DEVICE WITH PROTECTIVE LAYER, which is based upon and claims the benefit of Japanese Patent Applications No. 2000-101304 filed on Mar. 31, 2000, the contents of which are incorporated herein by reference.

BACKGROUND OF THE INVENTION

1. Field of the Invention

This invention relates to an organic EL (electroluminescent) device comprising, on a substrate, a structure in which organic luminescent material is disposed between a pair of electrodes which face to each other, and having a protective layer for covering the organic luminescent material on the outer surface of the structure.

2. Description of the Related Art

In general, an organic EL device comprises, on a substrate, a structure in which organic luminescent material is disposed between a pair of electrodes that face to each other. However, it has had a problem that the organic luminescent material deteriorates due to moisture within the use environment, thus causing a non-luminescent area in the luminescent area of the structure and aggravating the quality of display. In order to solve this problem, Japanese Patent Laid-Open No. Hei. 7-161474 proposes a method of forming an inorganic amorphous film made of carbon or silicon by CVD (chemical vapor deposition) so as to cover the organic luminescent material on the outer surface of the structure and of using it as a protective layer.

However, according to the study conducted about the above-mentioned publication, it has been found that the moisture resistance of the protective layer is low because its coverage over the structure is insufficient and that it causes a non-luminescent area when it is operated in a high-temperature and high-moisture atmosphere (65° C. and 95% RH for example).

SUMMARY OF THE INVENTION

The present invention has been made in view of the above problems. An object of the present invention is to provide an organic EL device comprising, on a substrate, a structure in which organic luminescent material is disposed between a pair of electrodes and having a protective layer that covers the organic luminescent material sufficiently with improved coverage.

According to the present invention, briefly, a protective layer of an organic EL device is formed by an atomic layer epitaxy (ALE) method on a surface of a luminescent structure to cover an organic luminescent material. The ALE method utilizes a reaction occurring on the surface where the protective layer is to be formed, and therefore, the protective layer can be formed uniformly along the surface. As a result, the coverage of the protective layer over the surface can be improved, and moisture resistance of the protective layer is also improved.

The protective layer may be composed of a single layer or of a plurality of layers laminated with one another. The protective layer may contain a stress relaxing component for relaxing an internal stress produced therein. When the protective layer is composed of first and second layers, the first and second layers are preferably formed to have internal stresses different from each other. Accordingly, the total stress of the protective layer can be relaxed while keeping sufficient coverage to the structure, so that the protective layer hardly has damages such as cracks due to the internal stress. The first layer and the second layer may be made of an identical material or be made of different materials from each other.

BRIEF DESCRIPTION OF THE DRAWINGS

Other features of the present invention will become more readily apparent from a better understanding of the preferred embodiments described below with reference to the following drawings, in which.

Figure 1:
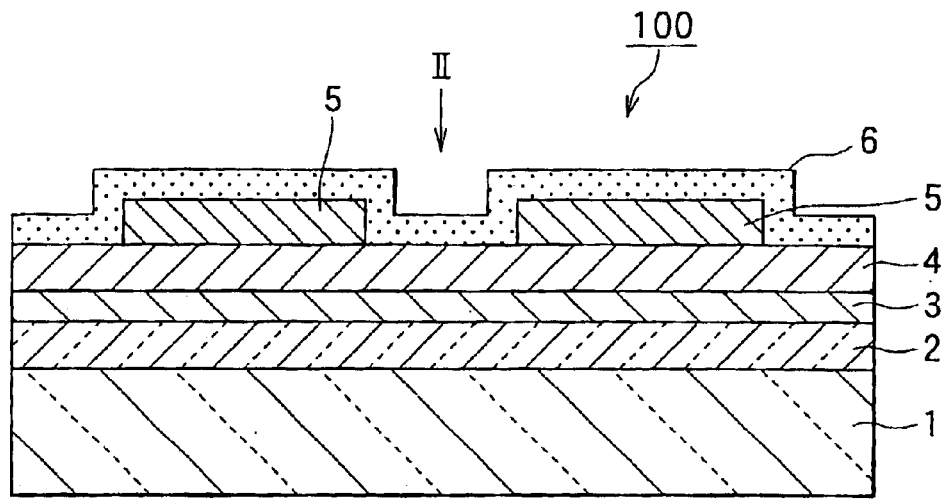
FIG. 1 is a partial sectional view showing an organic EL device, taken long line I—I in FIG. 2, according to a first embodiment of the invention.

DETAILED DESCRIPTION OF THE PREFERRED EMBODIMENTS (First Embodiment)

An organic EL (electroluminescent) device 100 according to a first embodiment of the invention will be explained below with reference to FIGS. 1 and 2.

An anode (lower electrode) 2 which is made from a transparent conductive film such as ITO (indium-tin-oxide) film and which functions as a hole injection electrode is formed on one flat surface of a glass substrate 1. As shown in FIG. 2, the anode 2 is formed into stripes that extend in an x-direction by patterning (etching) the ITO film (of 150 nm in thickness for example) that is formed on the glass substrate 1 by a sputtering method. The stripes of the anode 2 are respectively 500 μm in width and are arrayed at intervals of 50 μm.

A hole transporting layer 3 and an organic luminescent layer 4 made of organic luminescent materials are formed on the anode 2 one after another. In the present embodiment, tetratriphenylamine (TPTE) whose glass transition point (Tg point) is about 130° C. is deposited at thickness of about 40 nm to form the hole transporting layer 3, and tris (8-quinolinol) aluminum (Alq) whose Tg, point is 170° C. and which is doped with a quinachlidone compound is deposited at thickness of about 50 nm to form the organic luminescent layer 4 one after another in vacuum of about $10^{-6}$ Torr. The quinachlidone compound is a fluorescent material and has no Tg point.

Then, a cathode (upper electrode) 5 which is made of metal and which functions as an electron injection electrode is formed on the organic luminescent layer 4. In the present embodiment, the cathode 5 is an Al (aluminum) film with a thickness of 100 nm, and as shown in FIG. 2, formed by vacuum deposition using a mask into stripes that extend in a y-direction to cross approximately at right angles with the anode 2. For example, the stripes of the cathode 5 are respectively 500 μm in width, and are arrayed at intervals of 50 μm.

Thus, the organic EL device 100 is a dot matrix display in which areas where the anode 2 and the cathode 5 intersect and overlap each other compose display pixels (luminescent areas) to be displayed. In FIG. 2, the anode 2 and the cathode 5 overlap each other to compose plural rectangular display pixels G.

While the organic EL device 100 comprises the structures 2 to 5 in which the organic luminescent layer 4 is disposed between the pair of electrodes 2,5 facing each other on the glass substrate 1, it also has a protective layer 6 on the outer surface of the structures 2 to 5 to cover the organic luminescent materials 3, 4 to protect them from the outside environment. In the present embodiment, the protective layer 6 is an alumina ($Al_2O_3$) film formed by an ALE method to have a thickness of about 400 nm.

The protective layer 6 covers the cathode 5 and other regions where the cathode 5 is not formed on the luminescent layer 4. As shown in FIG. 2, the area covered with the protective layer 6 (protective layer formation area), which is hatched in the figure for easy recognition, is wider than the area where the organic luminescent layer 4 is formed (luminescent layer formation area indicated by two dot chain lines) to protect the underlying organic luminescent layer 4. The protective layer formation area is formed by using a silica glass mask or the like so that connection terminals 2a, 5a of the anode 2 and the cathode 5 are exposed and are connected with an external circuit (not shown).

In the organic EL device 100, when driving DC voltage having a predetermined duty ratio is applied across the anode 2 and the cathode 5 by the external circuit, holes move from the anode 2 and electrons move from the cathode 5 at selected display pixels G. Then, holes and electrons recombine in the organic luminescent layer 4 to release energy that causes the fluorescent material (quinachlidon compound in the present embodiment) to emit light. This luminescence is taken out from the side of the glass substrate 1.

Figure 3:
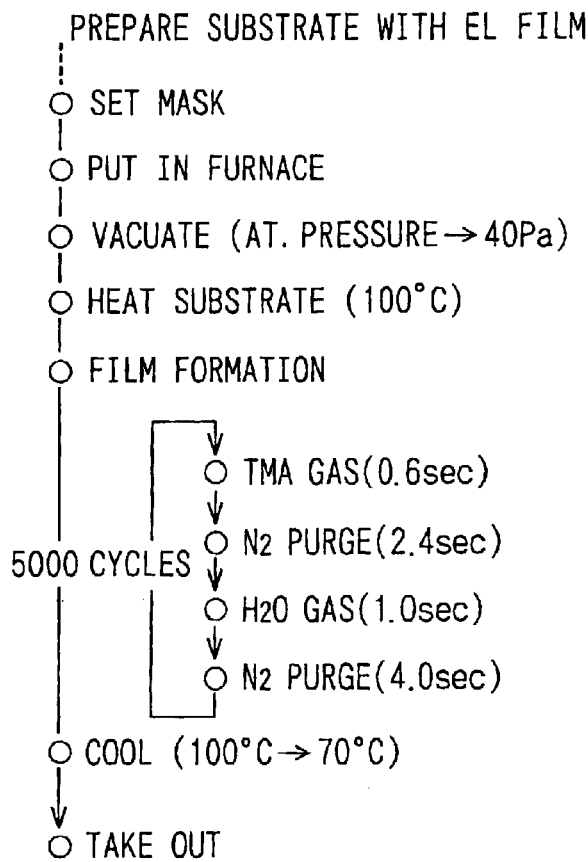
FIG. 3 is a flowchart showing one example of a process for forming a protective layer according to the first embodiment.

Meanwhile, the protective layer 6 protecting the structures 2 to 5 is formed by the ALE method, and this is the most prominent feature of the present embodiment. Next, the structure and the method for forming the protective layer 6 will be described in detail. First, one concrete example for forming the protective layer 6 will be described with reference to a flowchart shown in FIG. 3.

First, the mask made of silica glass is fixed, by a holder, onto the glass substrate 1 (glass substrate having the organic EL thin film) on which the anode 2, the organic layers 3, 4 and the cathode 5 are deposited, and the glass substrate 1 is put into a reaction furnace. The reaction furnace is vacuumed to about 40 Pa and the glass substrate 1 is heated while flowing $N_2$ gas at about 400 sccm to stabilize the substrate temperature at 100° C.

Then, TMA (trimethylaluminum) is held at 28° C. within a source material bottle, and $H_2O$ is held at room temperature (24° C.) within another source material bottle. They are vaporized under reduced pressure to be conducted into the reaction furnace alternately by $N_2$ gas as carrier gas (flow rate: 400 sccm) as follows. First, after vaporized TMA is introduced for 0.6 seconds, $N_2$ gas is introduced for 2.4 seconds as purge gas to remove excessive TMA existing in gaseous phase other than molecules adhering on the surface of the substrate 1. After that, vaporized $H_2O$ is introduced for 1.0 second, and $N_2$ purge gas is introduced for 4.0 seconds similarly.

The protective layer 6 is deposited by repeating this cycle of introducing TMA→purge→introducing $H_2O$→purge 5000 times (about 11 hours). During the deposition, the pressure within the reaction furnace is 150 to 300 Pa and the substrate temperature is held at 100° C. by a heater within the reaction furnace. After the deposition is finished, the substrate is cooled while introducing $N_2$ gas at 400 sccm and the reaction furnace is returned to atmospheric pressure at the point of time when the substrate temperature drops to 70° C. Then, the glass substrate 1 is taken out. Accordingly, alumina ($Al_2O_3$) of about 400 nm in thickness is obtained as the protective layer 6. It is noted that the thickness is measured by observing the section of the protective layer 6 by a TEM (transmission electron microscope).

Here, it is preferable to set the substrate temperature (film formation temperature) in forming the protective layer 6 at a temperature below the Tg points of the organic luminescent materials 3, 4 (TPTE and Alq in the present embodiment) that are formed in advance. It is because the organic luminescent materials are crystallized and the luminous efficiency drops if the film formation temperature is higher than the Tg points. In the example described above, the substrate temperature is set at 100° C., which is lower than the Tg point (130° C.) of TPTE that is the lowest among the organic luminescent materials 3, 4 by about 30° C.

Figure 4:
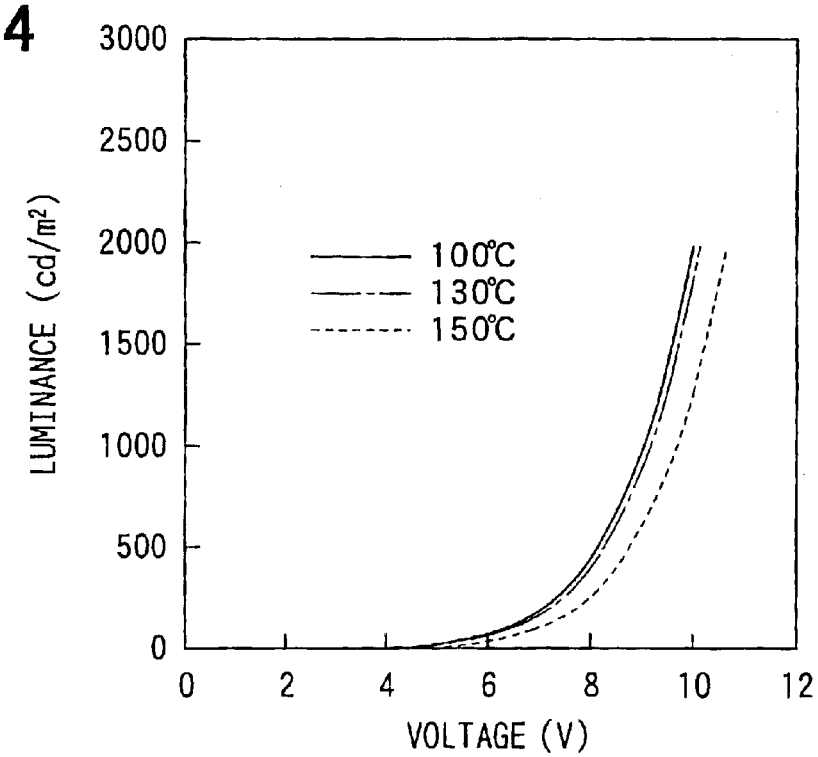
FIG. 4 is a graph showing a relationship between protective layer formation temperature, voltage and luminance of the organic EL device by an ALE method.

FIG. 4 is a graph showing the result confirmed how voltage-luminance characteristic of the device changes with respect to the film formation temperature (substrate temperature). Although almost no difference is seen when the film is formed at 100° C. and at 130° C. (Tg point of TPTE), it can be seen clearly that the voltage-luminance characteristic is shifted to the right side when the film formation temperature is 150° C. This is considered to occur because the crystallization of TPTE progresses and the luminous efficiency drops during the process of forming the protective layer 6 at 150° C.

Next, the thickness, composition and processing of the protective layer 6 and a film formation apparatus by the ALE method will be explained in detail.

[Thickness of Protective Layer]

The thickness of the protective layer 6 is not limited to a specific range provided that the required characteristics as the protective layer 6 are satisfied in the present embodiment. Although the thicker the thickness is, the higher the reliability becomes in general, the protective layer 6 may be thin as long as it falls within the allowance of the process and of the protecting characteristics because film formation time is long in case of the ALE method. However, the thickness is preferably at least 5 nm or more, and more preferably 50 nm or more empirically in order to cover foreign matters produced in the underlying layers (structures 2 to 5) during the process, thereby preventing pinholes.

Neither pinhole nor defect is produced even if the protective layer 6 is thin, and the protective layer 6 can fully protect the organic luminescent materials 3, 4 from moisture and oxygen within the atmosphere as long as the substrate surface is clean. This is because a step coverage rate is almost 100% if the substrate adsorption rate of gas is uniform in the ALE method. It becomes possible to avoid cracks from occurring by thinning the protective layer 6 because the total stress of the protective layer 6 may be reduced.

Figure 5:
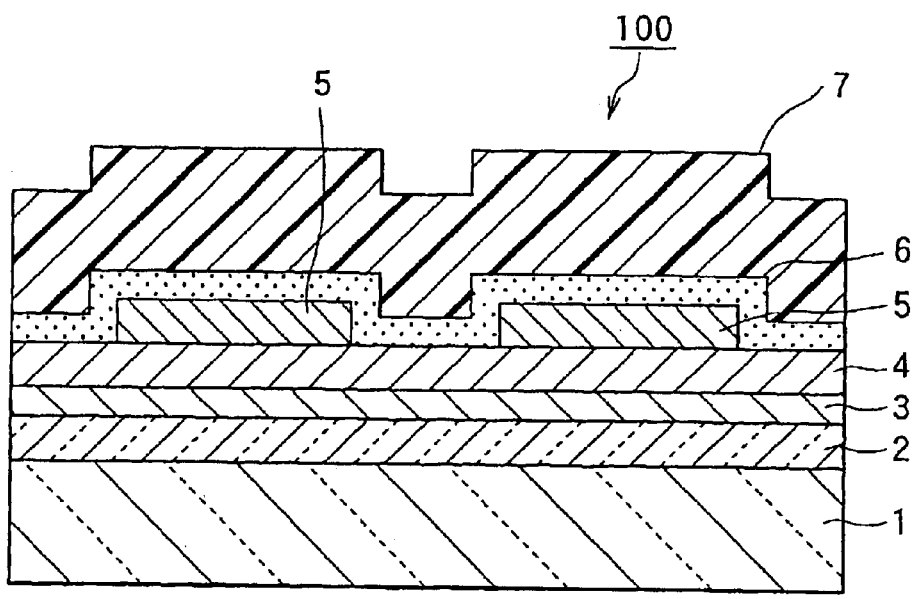
FIG. 5 is a partial sectional view showing the organic EL device in which a film for protecting the protective layer is provided.

A resin film (physical damage protective layer) for protecting the protective layer 6 from physical damages may be disposed on the protective layer 6 so as to protect the organic luminescent materials 3, 4 from scratches caused in processing the substrate or from physical damages caused in assembling in the product level. FIG. 5 shows the organic EL device 100 with the resin film 7.

Here, the composition, film formation method and thickness of the resin film 7 are not limited specifically. For example, after the protective layer 6 is formed from $Al_2O_3$ by the ALE method in accordance with the process shown in FIG. 3 to have a thickness of about 50 nm, the resin film 7 may be formed from paraxylene polymer to have a thickness of about 2 $\mu$m by vapor deposition or the like. Besides that, the resin film 7 may be a film made of organic material such as rubber material, acrylic resin, silicone resin, and epoxy resin, which may be formed by spin-coating, screen printing or application method. It is noted that the temperature is preferable to be below the Tg points of the organic luminescent materials 3, 4 also in the process for forming the resin film 7 (including a hardening step and others by a spin-coating method).

[Composition of Protective Layer]

Although the protective layer 6 should be formed by the ALE method, the composition is not limited as long as the protective layer 6 can be formed at the temperature below the Tg points of the organic luminescent materials 3, 4 as described above, is stable physically and chemically and satisfies the required characteristics. For example, it is preferable to be oxide, nitride or oxide-nitride (oxygen nitride) of metal or silicon.

Although source material for forming the protective layer 6 is not also limited, the gasification temperature of the source material is preferably lower than the reaction furnace temperature and the substrate temperature so that the source material gas once gasified does not aggregate or coagulate again. It is further preferable for the source material to gasify at temperature lower than the film formation temperature and to produce an amount of gas sufficient for film formation. The source material should be selected based on a saturated vapor pressure curve as a reference because the source material gasification temperature is determined from desirable gas concentration and pressure.

For instance, the protective layer 6 made of aluminum oxide may be deposited by causing alkyl metal such as TMA, TEA (triethyl aluminum) and DMAH (dimethyl aluminum hydride) to react with $H_2O$, $H_2O_2$, $O_2$, $O_3$ or alcohol such as $CH_3OH$ and $C_2H_5OH$. It is also possible to form the protective layer 6 composed of nitride compound such as AlN or AlxOyNz by causing the alkyl metal described above and nitride compound gas such as $NH_3$ to react with each other. It is also possible to form $SiO_2$ by using $SiCl_4$ as silicon material and by causing its gasified gas to react with gasified gas of $H_2O$.

In the ALE method, the efficiency of reaction is improved by irradiating UV (ultraviolet ray) onto the substrate to activate the chemical reaction, and accordingly, the protective layer 6 can be formed at temperature lower than the Tg points of the organic materials 3, 4. In this case, although the deterioration of the organic materials 3, 4 is concerned by the irradiation of UV, they are influenced less by the irradiation of UV because their luminescent areas are masked by the cathode 5.

It should be noted in forming the protective layer 6 on the organic luminescent layer 4 that there is a possibility that the chemical reaction in forming the protective layer 6 deteriorates the organic luminescent layer 4. For instance, when the protective layer 6 of aluminum oxide is to be formed by the ALE method, there is a possibility that the exposed part of the organic luminescent layer 4 deteriorates by decomposition or the like depending on an exposure time during the formation because TMA is Lewis acid. $H_2O$ also may cause deterioration such as the occurrence and increase of non-luminescent areas when it exceeds a certain amount.

Figure 2:
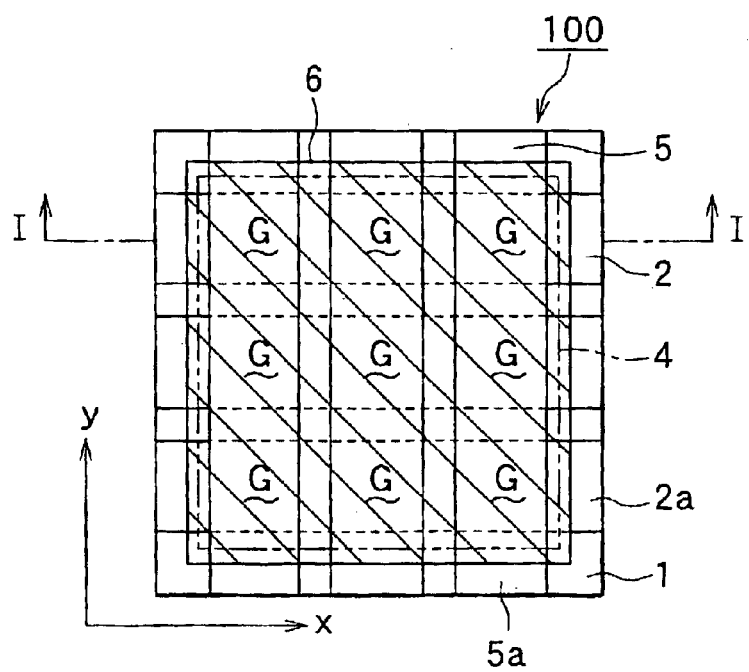
FIG. 2 is a schematic plan view of the organic EL device shown in FIG. 1, from a side indicated by arrow II in FIG. 1.

For instance, when the organic luminescent layer is exposed on the surface as the underlying layer of the protective layer 6 like the organic EL device 100 shown in FIG. 1, pulse times and concentrations of TMA and $H_2O$ during the ALE formation should be controlled appropriately because the organic luminescent layer 4 is directly exposed to TMA and $H_2O$. In this case, before the protective layer 6 is formed, a deterioration protective film may be formed on the organic luminescent layer 4 by the ALE or other methods (deposition, sputtering and the like) using gas that does not adversely affect the organic luminescent layer 4.

[Processing of Protective Layer]

Connecting terminal sections (electrode terminal sections) 2a, 5a of the cathode (upper electrode) 5 and the anode (lower electrode) 2 of the organic EL device 100 are formed with no protective layer 6 by using a mask of silica glass or the like or by removing in a following step. The connecting terminal sections 2a, 5a are parts bonded to wires by way of soldering or the like in a following step.

Here, although the material of the mask is not limited to silica glass because it is provided only not to form the protective layer 6 on the terminal sections 2a, 5a, the mask must be prevented from being deformed (being warped, or separating) thermally. For instance, although a SUS (stainless) mask of about 0.2 mm in thickness may be used, the thermal deformation must be prevented as well.

In such a case, it is preferable to externally apply pressure so that the mask adheres closely to the substrate or to inversely tapering the edge of the mask so that gas hardly turns around it. The mask may be formed from organic material such as rubber material and epoxy resin by application, screen-printing or spin-coating as long as the heat resistance of the mask material sustains the substrate temperature.

Otherwise, the protective layer 6 may be formed, without using a mask, at the entire surface of the glass substrate 1 on which the structures 2 to 5 are formed. In this case, after that, the protective layer 6 is removed from the desired regions such as the connecting terminal sections 2a, 5a by photolithography and wet etching or dry etching. Still more, the protective layer 6 may be removed by a shot blast method or by a tape polishing method.

[Film Formation Apparatus]

Preferably, the protective layer 6 is formed within one vacuum apparatus without being released into air, thereby preventing deterioration of the organic EL device as much as possible. For instance, the structures 2 to 5 and the protective layer 6 can be formed within one chamber if the film formation apparatus allows both vacuum deposition and ALE methods therein. The same advantage can be obtained by forming the films by using a film formation apparatus having a mechanism for carrying the EL device to another film formation apparatus in vacuum. For instance, after the structures 2 to 5 are formed by a vacuum deposition apparatus in the same manner as described above, the protective layer 6 can be formed by the ALE method after the transportation to an ALE apparatus without releasing to air.

Thus, the present embodiment adopts the protective layer 6 formed by the ALE method and covering the organic luminescent materials 3, 4 on the outer surface of the structures 2 to 5. The ALE method allows a film to have a uniform thickness along the shape of a formation surface where the film is to be formed because it uses the reaction on the formation surface. Therefore, the protective layer 6 formed by the ALE method can also have a uniform thickness even if there exist steps and foreign materials on the outer surface of the structures 2 to 5.

Because of this, according to the present embodiment, the coverage of the protective layer 6 to the structures 2 to 5 can be improved as compared to a film formed by the conventional CVD method or the like. It can also prevent the resistance to moisture, so that non-luminescent areas can be suppressed from being formed in the display pixels G in the structures 2 to 5 due to moisture.

When the resin film 7 for protection is formed on the protective layer 6 as shown in FIG. 5, the resistance to moisture can be assured even if the protective layer 6 is thinned because the resin film 7 protects the underlying protective layer 6. Then, the formation (growth) time of the protective layer 6 by the ALE method can be shortened and the through-put can be improved by thinning the protective layer 6.

Also, as described above, if the temperature for forming the protective layer 6 is higher than the Tg points of the organic luminescent materials 3, 4, the organic luminescent materials 3, 4 within the underlying structures 2 to 5 may be gradually crystallized during the formation of the protective layer 6 to lessen the luminous efficiency. However, in the present embodiment, because the protective layer 6 is formed by the ALE method at the temperature lower than the Tg points of the organic luminescent materials 3, 4, the above problem can be avoided and the organic EL device 100 can be provided with higher luminous efficiency.

Next, the improvement of the coverage of the protective layer 6 over the structures 2 to 5 in the present embodiment will be described in detail, although the invention is not limited to those. Specifically, three kinds of devices are prepared as follows. A first device (X device; comparative example based on the prior art publication described above) has as a protective layer a $Si_3N_4$ film (amorphous film) formed by the plasma CVD method to have a thickness of about 2 μm. A second device (Y device; corresponds to FIG. 1) has as a protective layer $Al_2O_3$ formed by the ALE method to have a thickness of about 400 nm. A third device (Z device; corresponds to FIG. 5) has $Al_2O_3$ formed by the ALE method to have a thickness of about 50 nm and paraxylene polymer formed on the $Al_2O_3$ by deposition to have a thickness of about 2 μm, as a protective layer. It is noted that the X, Y and Z devices are manufactured under the same conditions as each other except that for the protective layer.

Figure 6:
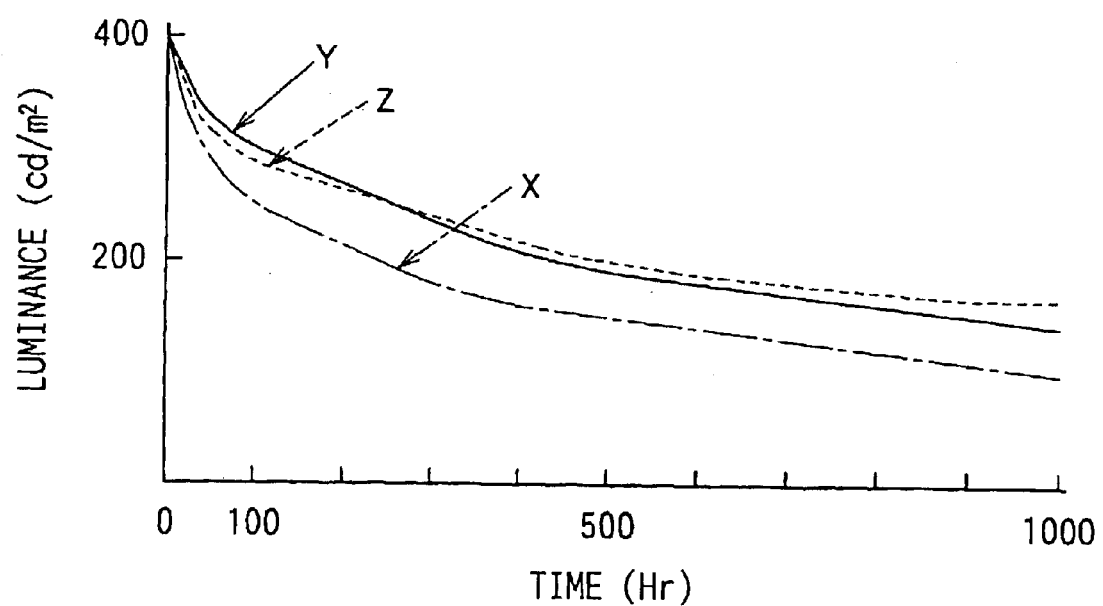
FIG. 6 is a graph showing the advantage of improving the coverage of the protective layer in the first embodiment.

The life of each of the X, Y and Z devices was compared by high-temperature and high-humidity operation test. The test was conducted within an atmosphere of 65° C. and 95% RH. FIG. 6 is a graph showing changes in luminance ($cd/m^2$) with respect to the operating time (Hr) at the test. It is noted that a current was regulated corresponding to the reduction of luminescent area to keep a current density constant as the luminance measuring condition at this time. As it is apparent from FIG. 6, the decreases in luminance of the Y device (solid line) and the Z device (broken line) are moderate as compared to that of the X device (one dot chain line).

Figure 7A:
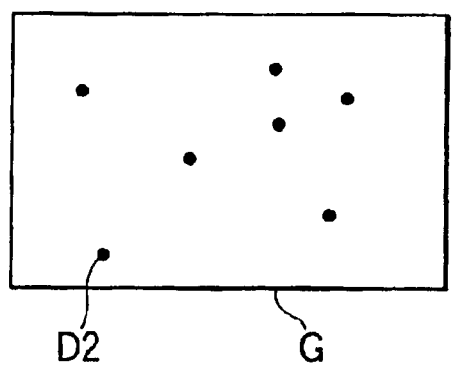
FIGS. 7A to 7C are schematic views showing the advantages for suppressing non-luminescent areas due to the improvement of the coverage of the protective layer.
Figure 7B:
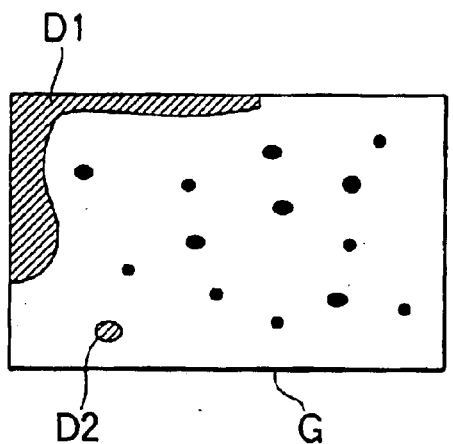
Figure 7C:
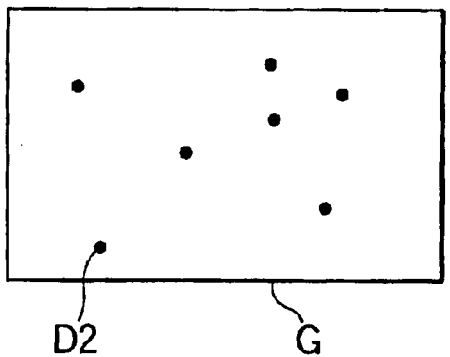

FIGS. 7A to 7C schematically show the luminescent area (one of the display pixels G described above) after operating for 200 hours in the high-temperature and high-humidity test described above. FIG. 7A shows the initial state in each of the devices X, Y and Z, FIG. 7B shows the state after operating the X device for 200 hours and FIG. 7C shows the state after operating the Y and Z devices for 200 hours. Here, dark spots D2 existing in FIG. 7A are produced by foreign materials such as dust existing originally on the organic luminescent layer 4 or the like.

As understood from FIGS. 7A to 7C, in the Y and Z devices, the protective layer 6 formed by the ALE method has good coverage. Further, a dark area D1 produced from the edge of the cathode 5, and the dark spots D2 (i.e., the non-luminescent areas) caused by pinholes or the like in the protective layer 6 can be suppressed from increasing and progressing. On the other hand, in the X device whose coverage to the pinholes and edge is insufficient, the dark area D1 and the dark spots D2 are grown due to infiltration of moisture and the number of dark spots D1 is increased.

(Second Embodiment)

Meanwhile, the protective layer 6 formed by the ALE method normally has a possibility that it causes stress (hereinafter called tensile stress) which causes the protective layer 6 itself to shrink, thus causing cracks or the like in the protective layer 6. When the crack occurs, it leads to the drop of the coverage of the protective layer 6 over the structures and to the decrease in resistance to moisture.

Here, the stress produced in the protective layer 6 may be separated into thermal stress caused by heat history and intrinsic stress of the layer itself. A certain degree of the thermal stress may be reduced by a glass substrate containing much alkaline metal such as soda glass as the glass substrate 1. This is because the stress caused by thermal contraction of the thin film can be reduced due to expansion and contraction by heating during the film formation because such glass substrate has a large coefficient of thermal expansion. The intrinsic stress described above is caused by the contraction of volume in the growth step of the protective layer 6, and is considered as a main cause of the tensile stress of the protective layer 6 formed by the ALE method.

In a second embodiment, in addition to the features in the first embodiment, the protective layer 6 has a function for relaxing the stress. Specifically, the protective layer 6 contains a component for relaxing the stress.

For instance, the protective layer 6 made of $Al_2O_3$ formed by the ALE method has a large tensile stress. In such a case, the tensile stress of the protective layer 6 may be reduced by adding atoms or molecules of N (nitrogen) or the like as a stress relaxing component to the protective layer 6. Thus, the tensile stress can be reduced while effectively using the advantages of the ALE method. It is considered that the crystal structure of $Al_2O_3$ is disturbed (the crystallinity is lowered) by adding the stress relaxing component to reduce the tensile stress.

The protective layer 6 containing the stress relaxing component may be formed by the ALE method using gas containing elementary component which operates as the stress relaxing component (hereinafter called as stress relaxing gas), differing from the material gas, together with the material gas constituting the protective layer 6.

For instance, N atoms may be contained, as the stress relaxing component, in $Al_2O_3$ of the protective layer 6. In this case, the protective layer 6 can be formed by the ALE method using gas of a nitrogen compound such as $NH_3$ and $N_2H_4$ as the stress relaxing gas in addition to TMA and $H_2O$ as material gas for forming the protective layer 6. When $NH_3$ is used, for instance, the following methods may be adopted. The methods include;

(1) a method of forming an AlxOyNz film as the protective layer 6 with a cycle of introducing TMA→purging →introducing $H_2O+NH_3$ (introducing $H_2O$ and $NH_3$ at the same time)→purging→ . . . ;

(2) a method of forming a laminated film of $Al_2O_3$ and AlN as the protective layer 6 by forming $Al_2O_3$ layers and AlN layers alternately with a cycle of introducing TMA→purging→introducing $H_2O$→purging→introducing TMA→purging→introducing $NH_3$→purging→ . . . ; and (3) a method of forming a laminated film of AlxOyNz+ AlN as the protective layer 6 by repeating the process of introducing TMA→purging→introducing $H_2O+$ $NH_3$→purging→ . . . a desired cycle number and then by repeating the process of introducing TMA→purging→introducing $NH_3$→purging→ . . . a desired cycle number.

Thus, the protective layer 6 may be composed of a single layer an entire portion of which contains the stress relaxing component such as the single AlxOyNz film as described in the method (1), or laminated layers each containing the stress relaxing component (N) as described in the method (3). Otherwise, the protective layer 6 may have a laminated structure in which the layer (AlN) containing the stress relaxing component (N) and the layer ($Al_2O_3$) containing no stress relaxing component are laminated as described in the method (2).

When atomic layers of the AlN thin film are grown by the reaction between TMA and $NH_3$, generally, the formation (growth) temperature is desired to be 300° C. or more from the aspects of a practical formation (growth) rate and the complete reaction. However, in this embodiment, the growth temperature may be low because the growth rate is not important and the reaction needs not be uniform. That is, the procedure of the cycle is not limited.

However, because AlxOyNz and AlN exhibit electrical conductivity depending on densities thereof, short circuit between wires may occur when one of them is formed directly on the cathode 5. Therefore, desirably, $Al_2O_3$ of 1 to 50 nm or another insulating layer is formed as a part directly contacting the cathode 5 and after that AlxOyNz and AlN are deposited.

Otherwise, when one of AlxOyNz and AlN contacts the cathode 5 directly, its growth should be controlled to contain N at, for example, 5 wt % or less so that it shows no conductivity in direct contact with the cathode 5. Although the control can be made simply by reducing the concentration of $NH_3$ gas in the ALE method, it is also possible to shorten the $NH_3$ gas introducing time (pulse time) per cycle or to reduce a number of introducing times.

When the AlxOyNz film is to be formed as the protective layer 6, aminoalkyl metal source material such as dimethylamino-dimethyl aluminum $((CH_3)_2NAl(CH_3)_2)$, dimethylamino-diethyl aluminum $((CH_3)_2NAl(C_2H_5)_2)$ or trimethylamin-aluane $AlH_3{:}N(CH_3)_3$ or azide compound such as dimethyl aluminum azide $((CH_3)_2AlN_3)$ or diethyl aluminum azide $((C_2H_5)_2AlN_3)$ may be used to react with $H_2O$ or $O_3$, in addition to the reaction of the material gas such as TMA, TEA or DMAH for forming the protective layer 6 with nitrogen compound as the stress relaxing gas.

Figure 8:
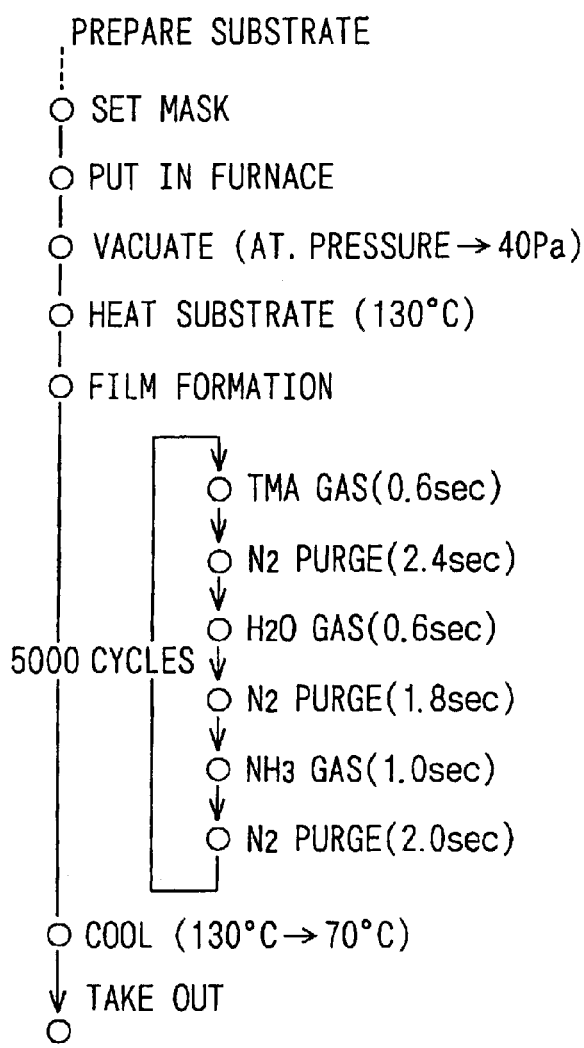
FIG. 8 is a flowchart showing one example of a process for forming a protective layer according to a second embodiment of the invention.

Next, one example inspecting the stress reducing effect of the protective layer 6 containing the stress relaxing component of the present embodiment will be described. It is noted that the present invention is not limited to this case. In the example, only the glass substrate 1 was used and the AlxOyNz film was formed directly on the substrate 1 as the protective layer 6 by using $NH_3$ gas as the stress relaxing gas. FIG. 8 is a flowchart showing the process for forming the protective layer 6 in the inspection example.

First, the glass substrate 1 (35 mm×45 mm) after cleaning was put into a reaction furnace. The reaction furnace was vacuumed to about 40 Pa and the glass substrate 1 was heated while flowing $N_2$ gas at about 400 sccm to stabilize the substrate temperature at 130° C. Then, TMA was held within a source material bottle at 28° C. and $H_2O$ was held within another source material bottle at room temperature (24° C.). Then, they were gasified under the reduced pressure and were introduced to the reaction furnace by $N_2$ gas (flow rate of 400 sccm) functioning as carrier gas. $NH_3$ gas was also supplied from a cylinder (flow rate of 10 sccm) and was introduced to the reaction furnace while mixing with $N_2$ diluted gas (flow rate of 390 sccm).

The introduction of gases to the reaction furnace was carried out as follows. First, gasified TMA was introduced for 0.6 seconds and then $N_2$ gas was introduced for 2.4 seconds as purge. Then, gasified $H_2O$ was introduced for 0.6 seconds, $N_2$ purge gas was introduced for 1.8 seconds, $NH_3$ gas was introduced for 1.0 second and $N_2$ purge gas was introduced for 2.0 seconds one after another in the same manner to form the film. Specifically, this cycle (the introduction of TMA→purge→the introduction of $H_2O$→purge→the introduction of $NH_3$→purge) was repeated 5000 times to form the film. During that time, the pressure in the reaction furnace was kept at 150 to 300 Pa and the substrate temperature was kept at 130° C. by a heater within the reaction furnace.

After finishing the growth of the film, the substrate was left to be cooled while introducing $N_2$ gas at 400 sccm. The reaction furnace was released to the atmospheric pressure at the point of time when the substrate temperature dropped to 70° C., and the glass substrate 1 was taken out. Accordingly, the AlxOyNz film of about 430 nm in thickness was obtained as the protective layer 6. Its composition was confirmed by RBS (Rutherford backward scattering) that the atomic weight ratio (x:y:z) of Al:O:N in the AlxOyNz film was 6:8:1.

Figure 9:
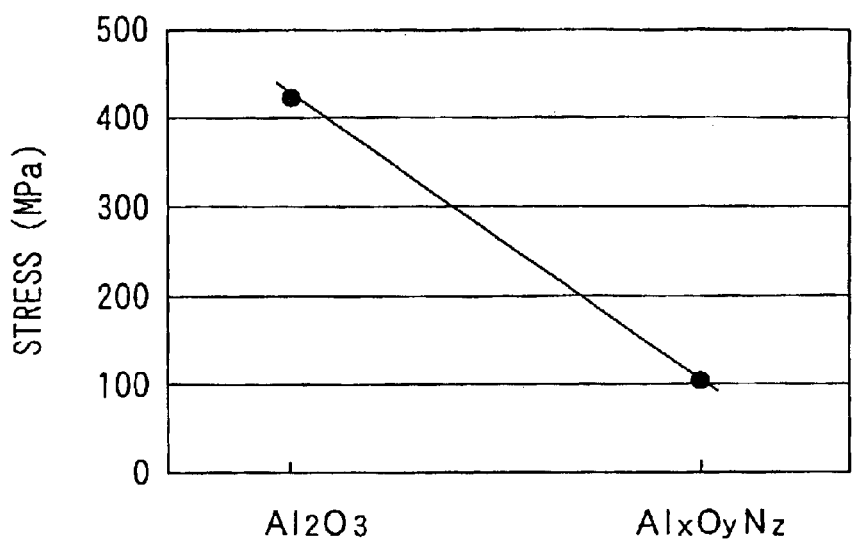
FIG. 9 is a graph showing the advantage for reducing stress of the protective layer in the second embodiment.

The stress caused by this AlxOyNz film was confirmed to be tensile stress of about 110 MPa as shown in FIG. 9 from the deformation (warpage) before and after the growth on the glass substrate 1. It is noted that the $Al_2O_3$ film having a thickness of about 400 nm (the protective layer formed by the process shown in FIG. 3) formed by the ALE method using TMA+$H_2O$ with the substrate temperature of 100° C. is amorphous, and the internal stress is about 430 MPa, indicating the tensile stress. That is, according to this inspection example, it is confirmed that the tensile stress produced in the protective layer 6 can be relaxed by N added as the stress relaxing component.

Thus, according to the present embodiment, in the organic EL device having the protective layer 6 containing the stress relaxing component, the damage of the protective layer 6 such as crack and peeling can be prevented, and the coverage of the protective layer 6 over the structures 2 to 5 can be improved more reliably.

(Third Embodiment)

Similarly to the second embodiment, a third embodiment also realizes a protective layer 6 that reduces stress produced therein, thereby reducing possibility of damages such as crack to the protective layer 6. Although the stress relaxing component is contained in the protective layer 6 in the second embodiment, in the present embodiment, the protective layer 6 is formed by laminating layers whose stresses produced therein are different from each other. That is, the protective layer 6 is formed by combining a film whose stress is relatively low and that relaxes stress (hereinafter referred to as a stress relaxing film) and a film whose stress is relatively high and that is difficult to relax stress (hereinafter referred to as a non-stress relaxing film).

Specifically, the protective layer 6 is so constructed that it includes laminated films whose characteristics are different from each other, by differentiating the forming conditions of the films from each other in the ALE method. At this time, the films whose characteristics (stresses produced inside) are different from each other may be made of the same constituent elements or may be made of different elements from each other. That is, the stress of the protective layer 6 as a whole needs to be reduced regardless of the material and the type of the protective layer 6 thus obtained.

A number of films and those composition ratios in the protective layer 6 are not limited provided that the total stress can be -reduced as compared to that of the protective layer made of a single layer. The protective layer 6 may be composed of a film having compression stress (hereinafter "−" (minus) is affixed to numerical values of stress) and a film having tensile stress, or of films having small stresses regardless of compression or tensile stress. Any structures and compositions are acceptable so long as the total stress of the protective layer 6 is reduced and neither crack nor separation (peeling) occurs to the protective layer 6 due to the stress produced therein when the films are formed on the structures 2 to 5.

Empirically, the total stress is preferably −150 MPa to 150 MPa as numerical values, and more preferably −50 MPa to 50 MPa. For instance, when the films constituting the insulating layer 6 are made of the same constituent elements, the films can have different film characteristics from each other by changing the forming conditions such as film formation temperature, gas supply amounts and flow rates on the substrate during the film formation.

In case of forming $Al_2O_3$ from TMA and $H_2O$ by the ALE method, the stress relaxing film can be formed with a lowered substrate temperature (growth temperature) in a range of, for example, 30° C. to 80° C. to have stress that is reduced as compared to one formed at a higher substrate temperature (e.g., 100° C.). The stress relaxing film may be also formed with a lowered reaction rate by reducing the supply amount of $H_2O$, which is oxidizing reaction gas. The supply amount can be reduced by, for example, shortening the introducing time of the gas.

Here, the supply amount of TMA should be increased as compared to the case of the higher substrate temperature because the adsorption rate to the substrate drops when the substrate temperature is lowered. The supply amount can be increased simply by rising the temperature of the source material bottle. When the film formation is performed as described above, because large amounts of unreacted methyl base and carbon remain within the film to produce internal defects, the stress relaxing film can be formed with reduced stress.

Because the internal defects are very microscopic, pinholes and step coverage can be prevented as long as the adsorption to the substrate, which is the basic of the ALE growth, is ideal. Considering the reliability of the organic EL device, it is better to form a still closer thin film above or under the stress relaxing film. In this case, the thin film may be formed by the ALE method continuously within the same reaction furnace at a substrate temperature in a higher temperature range of 100 to 140° C.

The thicknesses and the ratio in thickness of the films grown under these different conditions are not determined specifically. Further, the number and the structure of the films are not also limited as long as the total stress of the protective layer 6 is reduced as a whole by combining the stress relaxing film having much internal defects and the non-stress relaxing film having less internal defects.

Two or more protective layers 6 may be formed by the ALE method with different materials from each other. For instance, an $Al_2O_3$ film may be combined with a $SiO_2$ film. The $SiO_2$ film can be formed by causing gas obtained by gasifying liquid source material of $SiCl_4$ to react with $H_2O$. If the substrate temperature is about 100° C. in this combination of source materials, the stress can be reduced because residual elements such as Cl increase within the $SiO_2$ film.

Next, the present embodiment will be described more specifically with reference to the following inspection examples (first and second examples). It is noted that the present invention is not limited to them. In the examples, only the glass substrate 1 was used and the protective layer 6 was formed directly thereon to examine the stress reducing effect.

FIRST EXAMPLE

Figure 10:
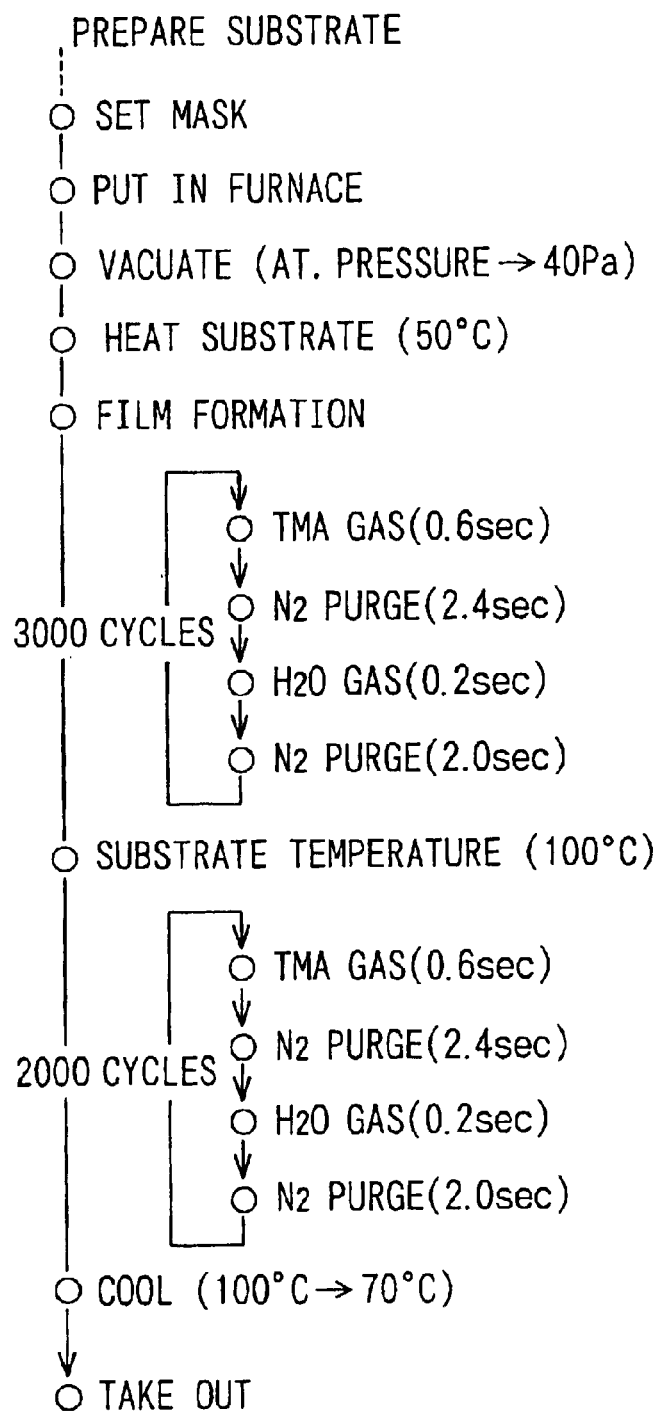
FIG. 10 is a flowchart showing one example of a process for forming a protective layer according to a third embodiment of the invention.

In the first example, films laminated and constituting the stress relaxing film 6 are made of the same constituent elements, and the characteristics of the films are made different from each other by changing the film formation temperatures. FIG. 10 is a flowchart showing a process for forming the protective layer 6 in this example.

First, the glass substrate 1 (35 mm×45 mm) after cleaning was put into the reaction furnace. The reaction furnace was vacuumed to about 40 Pa and the glass substrate 1 was heated while flowing $N_2$ gas at about 400 sccm to stabilize the substrate temperature at 50° C. TMA was held within a source material bottle at 28° C. and H$_2$O was held within another source material bottle at room temperature (24° C.). Then, TMA and H$_2$O were gasified under the reduced pressure and were introduced to the reaction furnace with N$_2$ gas (flow rate of 400 sccm) functioning as carrier gas.

Specifically, the gasified TMA was introduced for 0.6 seconds and then N$_2$ gas was introduced for 2.4 seconds as purge gas. Then, gasified H$_2$O was introduced for 0.2 seconds and N$_2$ purge gas was introduced for 2.0 seconds. This cycle (introduction of TMA→purge→introduction of H$_2$O →purge) was repeated 3000 times to grow the film. During this cycle, the pressure in the reaction furnace was kept at 150 to 300 Pa and the substrate temperature was kept at 50° C. by the heater within the reaction furnace.

After that, the substrate temperature was stabilized at 100° C. while introducing N$_2$ gas at 400 sccm. The film was further grown by repeating the cycle (of introducing TMA→purging→introducing H$_2$O→purging) 2000 times with the same pulse time as that when the substrate temperature was 50° C. After finishing the formation of the film, the substrate was left and cooled while introducing N$_2$ gas at 400 sccm and the reaction furnace was released to the atmospheric pressure at the point of time when the substrate temperature dropped to 70° C. Then, the glass substrate was taken out of the furnace.

Figure 11:
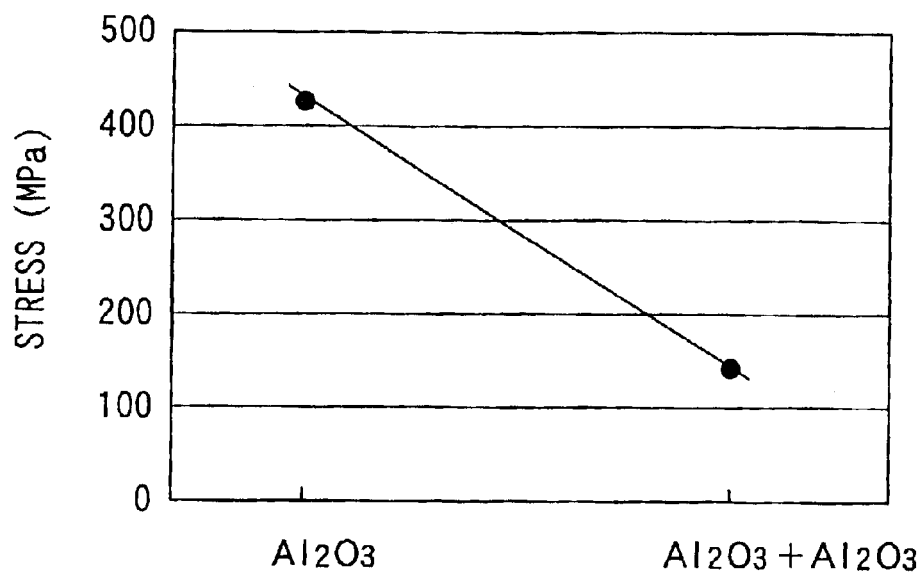
FIG. 11 is a graph showing the advantage for reducing stress of the protective layer formed by the process shown in FIG. 10.

Accordingly, an Al$_2$O$_3$ film of about 320 nm in thickness was obtained as the protective layer 6. The total stress of the protective layer (Al$_2$O$_3$+Al$_2$O$_3$) 6 of this example was confirmed to be tensile stress of about 140 MPa as shown in FIG. 11 from the deformation (warpage amount) of the glass substrate 1 before and after the film formation. It was also confirmed that the stress is low as compared to the single Al$_2$O$_3$ film (the protective layer formed by the process shown in FIG. 3) shown in the first embodiment.

Therefore, in the organic EL device 100 to which the first example is applied, the protective layer 6 can be composed of laminated films made of the same constituent elements and having different characteristics by changing the film forming conditions. Accordingly, the stress relaxing film and the non-stress relaxing film can be formed relatively. In the first example described above, the Al$_2$O$_3$ film formed at first at the substrate temperature of 50° C. is the stress relaxing film and the Al$_2$O$_3$ film formed later at the substrate temperature of 100° C. is the non-stress relaxing film.

The stress can be relaxed by the stress relaxing film. Although the stress relaxing film having much internal defects is liable to have insufficient coverage to the structure as described above, there is no problem at this point because the non-stress relaxing film having less internal defects can assure the coverage. Therefore, the stress produced in the protective layer 6 can be relaxed, so that the possibility of damages such as cracks to the protective layer 6 can be lowered. As a result, the coverage of the protective layer 6 over the structures 2 to 5 can be improved more reliably.

SECOND EXAMPLE

Figure 12:
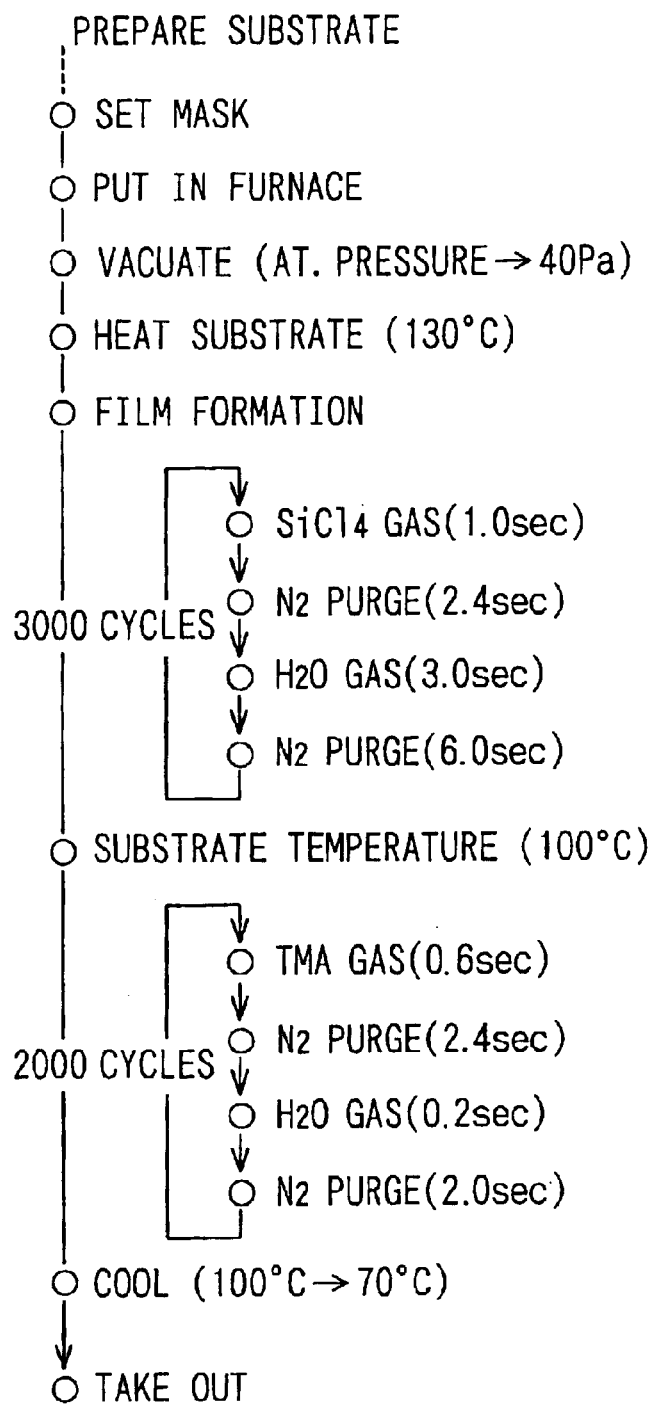
FIG. 12 is a flowchart showing another example of a process for forming the protective layer according to the third embodiment.

In the second example, films for constituting the protective layer 6 are formed to have different film characteristics from each other by forming them from different constituent elements from each other. FIG. 12 is a flowchart showing a process for forming the protective layer 6 in this example. Specifically, the glass substrate 1 (35 mm×45 mm) after cleaning was put into a reaction furnace. The reaction furnace was vacuumed to about 40 Pa and the glass substrate 1 was heated while flowing N$_2$ gas at about 400 sccm to stabilize the substrate temperature at 130° C.

Then, SiCl$_4$ and H$_2$O were gasified within source material bottles and were introduced to the reaction furnace alternately by N$_2$ gas (flow rate of 400 sccm) functioning as carrier gas as follows. That is, after introducing gasified SiCl$_4$ for 1.0 second, N$_2$ gas was introduced for 2.4 seconds. After that, gasified H$_2$O was introduced for 3.0 seconds and N$_2$ purge gas was introduced for 6.0 seconds in the similar manner. This cycle of introduction of SiCl$_4$→purge→introduction of H$_2$O→purge was repeated 3000 times to thereby form a SiO$_2$ film.

Next, the substrate temperature was stabilized at 100° C. while introducing N$_2$ gas at 400 sccm. Then, TMA and H$_2$O were gasified within the source material bottles and are introduced to the reaction furnace alternately by N$_2$ gas (flow rate of 400 sccm) functioning as carrier gas as follows.

After introducing gasified TMA for 0.06 seconds, N$_2$ gas was introduced for 2.4 seconds. After that, gasified H$_2$O was introduced for 0.2 seconds and N$_2$ purge gas was introduced for 2.0 seconds in the similar manner. This cycle of introduction of TMA→purge→introduction of H$_2$O→purge was repeated 2000 times so an Al$_2$O$_3$ film was grown on the SiO$_2$ film. After finishing the formations of the films, the substrate was left and cooled while introducing N$_2$ gas at 400 sccm, and the reaction furnace was released to the atmospheric pressure at the point of time when the substrate temperature dropped to 70° C. After that, the substrate 1 was taken out.

Figure 13:
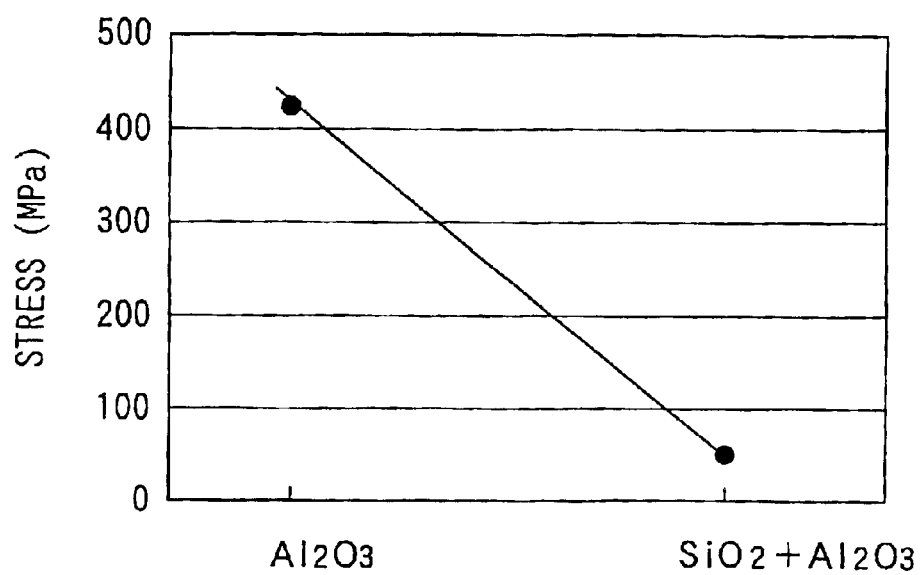
FIG. 13 is a graph showing the advantage for reducing stress of the protective layer formed by the process shown in FIG. 12.

In consequence, the SiO$_2$ film of about 70 nm in thickness and the Al$_2$O$_3$ film of about 160 nm in thickness can laminated with one another to form the protective layer 6. The total stress of the protective layer (SiO$_2$+Al$_2$O$_3$) 6 in this example was confirmed to be tensile stress of about 50 MPa as shown in FIG. 13 from the deformation (warpage amount) of the glass substrate 1 before and after the film formation. Thus, it can be confirmed that the stress is reduced as compared to the Al$_2$O$_3$ film (the protective layer formed in the process shown in FIG. 3) in the first embodiment.

In the organic EL device 100 to which the second example is applied, it is possible to form the stress relaxing film and the non-stress relaxing film relatively because the protective layer 6 can be formed by laminating two or more films whose film characteristics are differentiated from each other by composing the films of different materials from each other.

In the second example, the Al$_2$O$_3$ film formed at first at the substrate temperature of 130° C. is the non-stress relaxing film, and the SiO$_2$ film formed later at the substrate temperature of 100° C. is the stress relaxing film. The stress relaxing effect can be obtained by the stress relaxing film and the coverage can be obtained by the non-stress relaxing film. As a result, the protective layer 6, which reduces the possibility of damage such as crack, is realized and the coverage of the protective layer 6 over the structures 2 to 5 is improved more reliably.

(Fourth Embodiment)

Figure 14:
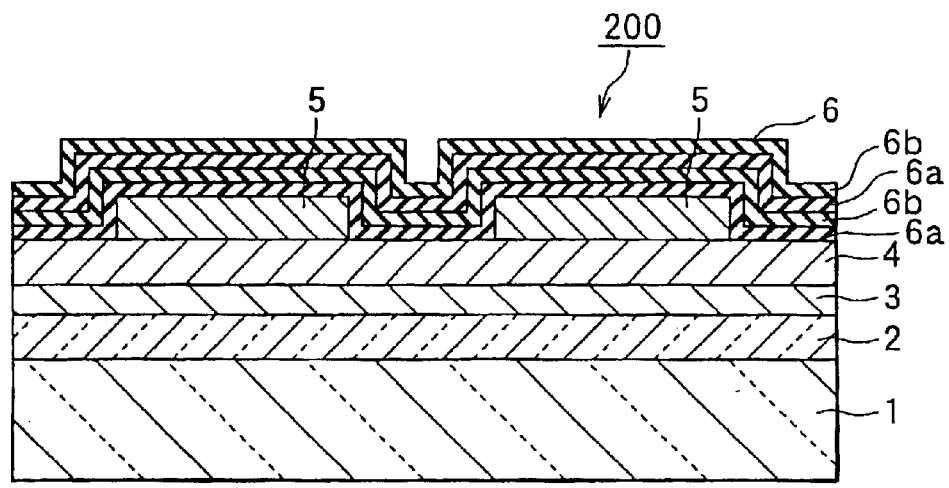
FIG. 14 is a partial sectional view showing an organic EL device according to a fourth embodiment of the invention.

FIG. 14 shows a partial sectional structure of an organic EL device 200 according to a fourth embodiment of the invention. Although the protective layer 6 is formed only by the ALE method in each embodiment described above, the present embodiment is characterized in that the protective layer 6 is composed of a layer (called an ALE layer) 6a formed by the ALE method and a layer (called a non-ALE layer) 6b formed by a method different from the ALE method.

In the present embodiment, the protective layer 6 is formed by alternately laminating the ALE layer 6a made of Al$_2$O$_3$ of several nm to several tens nm in thickness, and the non-ALE layer 6b made of Al$_2$O$_3$ made of several nm to several tens nm in thickness and formed by the CVD method. Here, the ALE layer 6a is formed right above the structures 2 to 5 and the non-ALE layer 6b is formed on the ALE layer 6a. Then, the layers 6a, 6b are laminated alternately thereafter. Although FIG. 14 shows four layers 6a, 6b, the number of layers is not limited.

Figure 15:
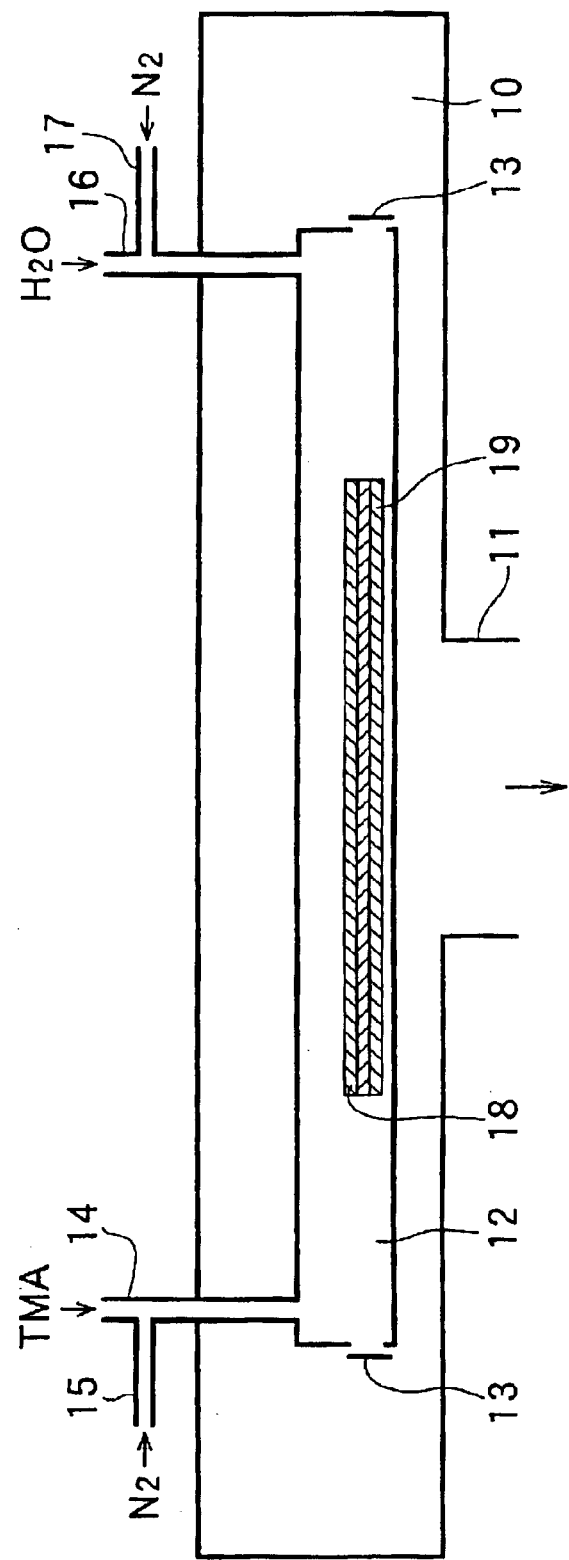
FIG. 15 is a structural view schematically showing a film formation apparatus according to the fourth embodiment.

Next, a method for forming the protective layer 6 of the present embodiment will be described. FIG. 15 shows a schematic structure of a film formation apparatus used in the present embodiment. The Al$_2$O$_3$ film as the ALE layer 6a is formed at first by the ALE method and successively the Al$_2$O$_3$ film as the non-ALE layer 6b is formed by the CVD method in this film formation apparatus.

The apparatus has a vacuum chamber 10 having a sealed structure parted and formed by stainless or the like and its inside communicates with an exhaust passage 11. The inside of the vacuum chamber 10 is vacuated through the exhaust passage 11 by a vacuum pump not shown (mechanical booster pump, a rotary pump or the like).

A reaction chamber 12 formed into a sealed structure by, for example, titanium or the like is provided within the vacuum chamber 10. Electric opening/closing shutters 13, which are controlled by a control circuit not shown and others, are formed on the wall sections of the reaction chamber 12. Substrates may be put into/taken out of the reaction chamber 12 by opening/closing the shutters 13. The pressure in the reaction chamber 12 is controlled by controlling the opening degrees of the shutters 13 and purge is promoted by fully opening at least one of the shutters 13.

The reaction chamber 12 is provided with pipe systems 14, 15, 16 and 17 made of stainless steel or the like to supply TMA gas, H$_2$O gas and N$_2$ gas into the reaction chamber 12. The pipe system 14 is a pipe of the TMA gas (TMA pipe system) for introducing the TMA gas to the reaction chamber 12. The pipe system 15 is a pipe system of the N$_2$ gas (TMA removing N$_2$ gas pipe system) for flowing the N$_2$ gas as purge gas for removing he remaining TMA gas after TMA gas is supplied for a predetermined time period by the TMA pipe system 14.

The pipe system 16 is a pipe system of H$_2$O gas (water pipe system) for introducing H$_2$O gas (reaction gas) to the reaction chamber 12 after purge gas is supplied by the TMA removing N$_2$ gas pipe system 15. The pipe system 17 is a N$_2$ gas pipe system (water removing N$_2$ gas pipe system) for flowing N$_2$ gas as purge gas for removing remaining H$_2$O gas after H$_2$O gas is supplied for a predetermined time period by the water pipe system 16.

These TMA pipe system 14, the water pipe system 16, the N$_2$ gas pipe systems 15 and 17 have valves and gas supply sources (not shown) that are controlled by a control circuit or the like (not shown), and compose adsorption gas supplying means, reaction gas supplying means and purge means, respectively.

The valves of the respective pipe systems 14 to 17 are opened/closed at predetermined timings, whereby the gases are supplied to the reaction chamber 12 alternately in the order of TMA, N$_2$ gas (purge gas), H$_2$O gas and N$_2$ gas (purge gas). It is noted that the pipe systems 14 to 17 penetrate the wall of the vacuum chamber 10 (where the penetrating parts are sealed), and are connected to the reaction chamber 12 by bolts or the like.

A substrate holder 19 for mounting a substrate (glass substrate or the like) 18 on which thin films are formed is disposed within the reaction chamber 12. The substrate holder 19 has a heater. The substrate 18 corresponds to the glass substrate 1 on which the structures 2 to 5 are formed in each embodiment described above. The substrate holder 19 may be a metal plate that has an area capable of mounting the substrate 18 and holes a sheath heater attached to the lower surface thereof so that it can be heated uniformly.

The substrate holder 19 also has a thermocouple (not shown) for measuring the substrate temperature so that the substrate 18 can be heated to desirable temperature while detecting the measurement value of the thermocouple by a temperature control circuit not shown. The substrate holder 19 is conveyable (transportable) so as to take in and out the substrate 18 to/from the reaction chamber 12.

In the film formation apparatus, the substrate 18 is mounted on the substrate holder 19 with heater and is conveyed to the reaction chamber 12 through the vacuum chamber 10 and the shutter 13. Then, the substrate 18 is heated by the substrate holder 19 up to a specific temperature (100° C. in the present embodiment) or more where a desirable reaction occurs.

When the temperature of the substrate 18 reaches the specific temperature (100° C. for example), TMA gas is fed from the TMA pipe system 14 to the reaction chamber 12. The atmospheric pressure within the reaction chamber 12 can be kept at about several hundreds Pa and TMA is adsorbed to the substrate 18 to form only one layer by adequately controlling the flow rate of TMA gas and the opening degree of the shutter 13 located at the opposite side with respect to the TMA pipe system 14. After that, the shutter 13 is fully opened and TMA gas remaining in the reaction chamber 12 is removed by flowing N$_2$ gas from the TMA removing N$_2$ gas pipe system 15.

Next, H$_2$O gas is fed from the water pipe system 16 to the reaction chamber 12. The flow rate of the H$_2$O gas and the opening degree of the shutter 13 located at the opposite side with respect to the water pipe system 16 are controlled adequately so that the vapor pressure within the reaction chamber 12 is kept constant and Al$_2$O$_3$ is formed by causing H$_2$O to react with the TMA adsorbed on the substrate 18. After that, the shutter 13 is fully opened to flow N$_2$ gas into the reaction chamber 12 from the water removing N$_2$ gas pipe system 17, thereby removing H$_2$O remaining in the reaction chamber 12.

Thus the film formation cycle in the ALE method (introduction of TMA→purge→introduction of H$_2$O→purge) is repeated until when the thickness of the film reaches to a desired thickness, thereby forming the ALE layer 6a, i.e., the first layer. After that, another film formation process is started by the CVD method as follows. It is noted although the film formation temperature (substrate temperature) by the CVD method is set at 100° C. the same as the film formation temperature by the ALE method described above, the present invention is not limited to such temperature and it may be room temperature or other temperatures.

First, TMA is gasified and is fed from the TMA pipe system 14 to the reaction chamber 12. The pressure in the reaction chamber 12 is kept at several hundreds Pa or more by controlling the amount of TMA gas and the opening degree of the shutter 13 located on the opposite side with respect to the TMA pipe system 14. Then, TMA is not only adsorbed to the substrate 18 but also remains around the substrate 18.

After that, the shutter 13 is fully opened, and H$_2$O is gasified and is fed from the water pipe system 16 to the reaction chamber 12 without flowing nitrogen gas from the TMA removing N$_2$ gas pipe system 15. Accordingly, TMA reacts with H₂O not only on the substrate 18 but also in the gaseous phase around the substrate 18 and Al₂O₃ can be formed. Thus, the non-ALE layer 6b is formed on the ALE layer 6a on the substrate 18. Because the film formation rate is fast in such CVD, vacancies in the film are less liable to vanish during the film formation and the internal stress can be reduced.

Thus, according to the present embodiment, because the protective layer 6 is composed of the ALE layer 6a formed by the ALE method and the non-ALE layer 6b formed by the CVD method, the film characteristics of the layers 6a and 6b can be differentiated from each other. The ALE layer 6a works as the non-stress relaxing film, and the non-ALE layer 6b works as the stress relaxing film, respectively.

Although the internal stress of the ALE layer 6a is about 430 Pa with the thickness of 400 nm even if the ALE layer 6a is formed at low temperature of about 100° C., the internal stress of the non-ALE layer 6b formed by the CVD method may be decreased to about −150 Pa. Accordingly, the total stress of the protective layer 6 composed of the multiple layers of the ALE layer 6a and the non-ALE layer 6b can be decreased to about 150 MPa as a whole with the thickness of 400 nm for example.

Figure 16:
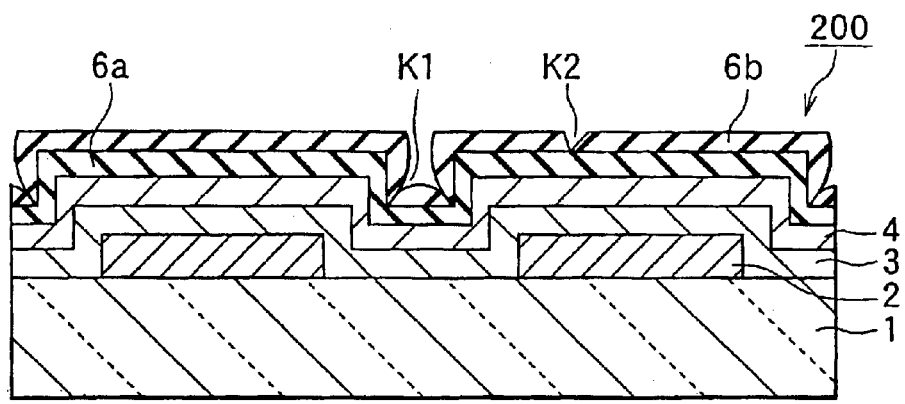
FIG. 16 is a schematic sectional view showing the advantage of improving the coverage of the protective layer according to the fourth embodiment.

The non-ALE layer 6b which functions as the stress relaxing film is a film having much internal defects and the like therein, so that its coverage over the structures 2 to 5 is liable to be insufficient. However, in the organic EL device 200 of the present embodiment, even if a coverage defective part K1 and a pinhole K2 occur in the non-ALE layer 6b as shown in FIG. 16, the resistance to moisture is no problem because the coverage of below that, i.e., the ALE layer 6a covering right above the structures 2 to 5, is sufficient. It is noted that FIG. 16 is a sectional view corresponding to the section of the part of FIG. 2 where the cathode 5 is not provided.

Accordingly, the present embodiment can also realize the protective layer 6 which can reduce the possibility of damage such as cracks therein by relaxing the stress occurring in the protective layer 6, and the coverage of the protective layer 6 over the structures 2 to 5 can be improved more. Still more, according to the present embodiment, because the part of the protective layer 6 is formed by the CVD method whose film formation rate is fast, the film formation time may be shortened as compared to the case of forming the entire protective layer 6 by the ALE method. It is noted that sputtering may be adopted as a method different from the ALE method, in addition to the CVD method.

(Fifth Embodiment)

Figure 17:
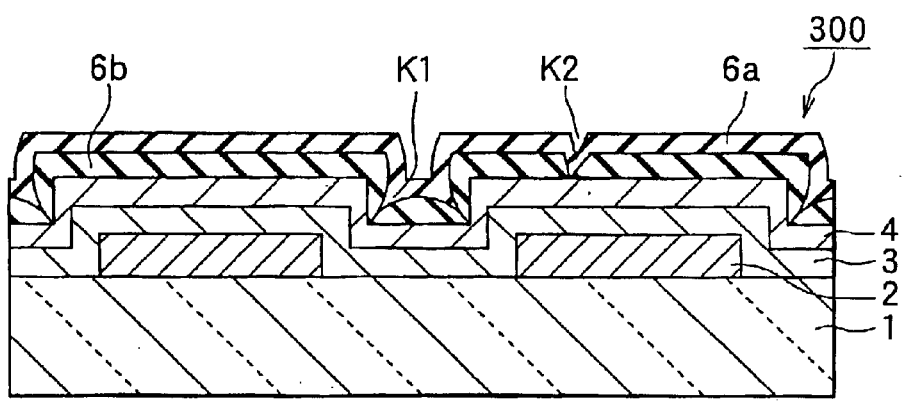
FIG. 17 is a partial sectional view showing an organic EL device according to a fifth embodiment.

FIG. 17 shows a partial section (section corresponding to FIG. 16) of an organic EL device 300 according to a fifth embodiment of the invention. The present embodiment is what the fourth embodiment is modified by reversing the order for laminating the ALE layer 6a and the non-ALE layer 6b over the structures 2 to 5 from that of the fourth embodiment. That is, as shown in FIG. 17, the two-layer structure is adopted by forming the non-ALE layer 6b right above the structures 2 to 5 and by forming the ALE layer 6a on the non-ALE layer 6b.

Here, one example of a method for forming the protective layer 6 of the present embodiment will be described. First, GeO (germanium oxide) having a thickness of 200 nm was formed as the non-ALE layer 6b by a resistance heating deposition method within the same vacuum deposition system in which the structures 2 to 5 are formed, thereby preventing the organic luminescent material from deteriorating due to the release to air as much as possible. Next, Al₂O₃ having a thickness of 400 nm was formed as the ALE layer 6a on the non-ALE layer 6b by the ALE method using TMA and H₂O as the source materials substantially in the same process shown in FIG. 3.

It is noted that the non-ALE layer 6b needs not to be always made of GeO and inorganic films such as SiO, LiF and AlF₃ that can be evaporated at relatively low temperature may be adopted. Still more, the non-ALE layer 6b needs not be always formed in the same vacuum deposition system as that for forming the structures 2 to 5.

The film formation method other than the ALE method, i.e., the non-ALE method, is not limited to deposition if the non-ALE layer 6b can be formed by a film formation apparatus equipped with a mechanism for conveying the devices to another film formation apparatus without releasing it to air after the structures 2 to 5 are formed. For example, after the structures 2 to 5 are formed on the glass substrate 1 by vacuum deposition, $Si_{1-x}N_x$ can be formed as the non-ALE layer 6b by conveying the device to a CVD apparatus without releasing it to air after the structures 2 to 5 are formed in the vacuum deposition apparatus.

In case of the CVD method, the stress produced in the non-ALE layer 6b can be readily controlled by the film forming conditions such as gas pressure. That is, because Al₂O₃ and others composing the ALE layer 6a are liable to produce tensile stress as described above, it is possible to prevent damages and separation of the protective layer 6 by canceling the tensile stress with compression stress of $Si_{1-x}N_x$.

The non-ALE layer 6b is not limited to the inorganic film but may be an organic film such as paraxylene polymer and polyimide. Those organic films can relax the tensile stress produced in the upper ALE layer 6a (Al₂O₃ or others) because elastic moduli of the organic films are very low. However, because the polarity of the organic films is weak, in the ALE method that presupposes the chemical adsorption of reaction gas, there is a possibility that a film is difficult to grow on the organic films or the adhesion at the interface of the organic film with the film formed by the ALE method becomes weak. Therefore, it is desirable to use adequate coupling agent such as silane coupling agent on the organic film before the ALE layer 6a is formed on the organic film as the non-ALE layer 6b.

Other disadvantages in applying these organic films as the non-ALE layer 6b are that their moisture resistance is low and their chemical and physical stabilities are low as compared to those of the inorganic film. Therefore, the organic film formed as the non-ALE layer 6b should have a thickness of at least about 1 µm to prevent the deterioration of the organic EL device caused by moisture in the air in case where it is released to the air once in shifting the organic EL device to the film formation apparatus for forming the ALE layer 6a. However, the thickness of the organic film depends on the time period of release to the air and to the humidity in air.

It is also desirable to form the organic film as the non-ALE layer 6b with the thickness of about 1 µm in order to prevent the organic film from being eroded by the source material gas for forming the ALE layer 6a by the ALE method. If the organic film is eroded with the source material gas, the organic luminescent materials 3, 4 right below the organic film would also be damaged due to the source material gas.

Thus, when the protective layer 6 is composed of the ALE layer 6a and the non-ALE layer 6b similarly to the fourth embodiment, the layers 6a and 6b can have film characteristics differentiated from each other and respectively function as the non-stress relaxing film and as the stress relaxing film likewise in the present embodiment.

There is also no problem about the resistance to moisture even if the coverage defective part K1 or the pinhole K2 occurs in the non-ALE layer 6b as shown in FIG. 17 because the coverage of the ALE layer 6a covering above them is good. That is, the coverage of the protective layer 6 can be maintained by the ALE layer 6a.

Thus, the present embodiment can also provide the protective layer 6 which can reduce the possibility of damage such as cracks by relaxing the stress produced therein and can steadily improve the coverage thereof over the structures 2 to 5. Still more, in the present embodiment, the film formation time may be shortened as compared to the case of forming the entire protective layer 6 by the ALE method.

It is noted that the hole transporting layer and organic luminescent layer as the organic luminescent materials are not limited to those described above but publicly known materials may be adequately used. Still more, the EL device is not limited to the structure in which the hole transporting layer and the organic luminescent layer as the organic luminescent materials are sandwiched between the pair or electrodes, but may have structures in which a hole injection layer, an electron transporting layer and an electron injection layer (these also correspond to the organic luminescent materials) exist adequately.

In short, the invention is characterized mainly in that it comprises the protective layer 6 formed by the ALE method and covering the organic luminescent materials 3, 4 on the outer surface of the structures in the organic EL device. The other features may be adequately modified or changed.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for manufacturing an organic EL device, comprising:

forming a luminescent structure composed of a pair of electrodes and an organic luminescent material disposed between the pair of electrodes on a glass substrate;

forming a protective layer by an ALE method on a surface of the luminescent structure to cover the organic luminescent material;

wherein the ALE method includes:

disposing the glass substrate with the luminescent structure into a reaction chamber;

creating a vacuum in the reaction chamber;

alternately introducing a first gas including an organic metal composition and a second gas including oxygen into the reaction chamber; and controlling a temperature of the glass substrate in the reaction chamber to be a first temperature that is lower than a glass transition point temperature of the organic luminescent material to form a first layer of the protective layer by the first gas and second gas and, after the first layer is formed, controlling the temperature of the glass substrate in the reaction chamber to be a second temperature that is different from the first temperature and lower than the glass transition point temperature of the organic luminescent material to form a second layer of the protective layer by the first gas and second gas, wherein the alternately introducing the first and second gases is repeatedly performed over several cycles to form the protective layer of a predetermined thickness as a metal oxide including the organic metal composition, wherein:

the first gas is comprised of trimethylaluminum;

the second gas is comprised of gasified $H_2O$; and the second temperature of the glass substrate is set to be higher than the first temperature so that the first layer is a stress relaxing alumina film and the second layer is a non-stress relaxing alumina film.

* * * * *